United States Patent
Lee et al.

(10) Patent No.: US 9,560,738 B2
(45) Date of Patent: Jan. 31, 2017

(54) TOUCH WINDOW

(71) Applicant: LG INNOTEK CO., LTD., Seoul (KR)

(72) Inventors: Dong Keon Lee, Seoul (KR); Beom Sun Hong, Seoul (KR); Jung Ki Lee, Seoul (KR); Jun Phill Eom, Seoul (KR); Jun Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/087,496

(22) Filed: Nov. 22, 2013

(65) Prior Publication Data
US 2014/0138143 A1     May 22, 2014

(30) Foreign Application Priority Data

Nov. 22, 2012    (KR) .................. 10-2012-0133166
Jul. 16, 2013    (KR) .................. 10-2013-0083662

(51) Int. Cl.
*G06F 3/044*     (2006.01)
*H05K 1/02*     (2006.01)

(52) U.S. Cl.
CPC ............. *H05K 1/0213* (2013.01); *G06F 3/044* (2013.01)

(58) Field of Classification Search
CPC .... H01L 27/01; H01L 27/13; G06F 2203/041; G06F 2203/04102; G06F 3/044; G06F 3/045; G06F 2203/04111–2203/04113; H05K 1/0213
See application file for complete search history.

(56) References Cited

U.S. PATENT DOCUMENTS 6,501,529 B1* 12/2002 Kurihara et al. ............ 349/160
8,614,692 B2* 12/2013 Hwang ............... G02F 1/13338
                                                     345/174

(Continued)

FOREIGN PATENT DOCUMENTS

CN     101738773 A     6/2010
CN     101788867 A     7/2010
(Continued)

OTHER PUBLICATIONS

Office Action dated Mar. 28, 2016 in Chinese Application No. 201310596209.4.
(Continued)

*Primary Examiner* — Lun-Yi Lao
*Assistant Examiner* — Kelly B Hegarty
(74) *Attorney, Agent, or Firm* — Saliwanchik, Lloyd & Eisenschenk

(57) ABSTRACT

A light emitting device according to the embodiment includes touch window including: a substrate; and an electrode part on the substrate, wherein the electrode part includes: a first sub-pattern; an electrode layer on the first sub-pattern; and a second sub-pattern close to the first sub-pattern, and wherein a boundary area between the electrode layer and the first sub-pattern is larger than a boundary area between the substrate and the first sub-pattern. A light emitting device package according to the embodiment includes a touch window including: a substrate; and an electrode part on the substrate; wherein the electrode part includes: a first sub-pattern; an electrode layer on the first sub-pattern; and a second sub-pattern close to the first sub-pattern, and wherein a line width of the first sub-pattern is changed according to a height of the first sub-pattern.

20 Claims, 11 Drawing Sheets

(56) References Cited

U.S. PATENT DOCUMENTS

| | | | |
|---|---|---|---|
| 8,729,910 B2* | 5/2014 | Meng et al. | 324/658 |
| 8,780,080 B2* | 7/2014 | Nagata et al. | 345/174 |
| 2009/0180043 A1* | 7/2009 | Rho et al. | 349/12 |
| 2009/0218310 A1 | 9/2009 | Zu et al. | |
| 2009/0303193 A1* | 12/2009 | Lim et al. | 345/173 |
| 2010/0141598 A1* | 6/2010 | Yamauchi | G06F 3/045 345/173 |
| 2011/0032209 A1* | 2/2011 | Kim | G06F 3/044 345/174 |
| 2011/0069033 A1* | 3/2011 | Meng et al. | 345/174 |
| 2011/0069036 A1* | 3/2011 | Anno | 345/174 |
| 2011/0141037 A1* | 6/2011 | Hwang et al. | 345/173 |
| 2011/0141058 A1* | 6/2011 | Onaka | 345/174 |
| 2011/0146794 A1* | 6/2011 | Tsai | 136/259 |
| 2012/0062250 A1 | 3/2012 | Kuo | |
| 2012/0068200 A1* | 3/2012 | Oh et al. | 257/88 |
| 2012/0069259 A1* | 3/2012 | Oh et al. | 349/43 |
| 2012/0105342 A1* | 5/2012 | Yu | 345/173 |
| 2012/0127413 A1* | 5/2012 | Shin et al. | 349/139 |
| 2012/0154728 A1* | 6/2012 | Oh et al. | 349/138 |
| 2012/0299872 A1* | 11/2012 | Nishikawa | G06F 3/045 345/174 |
| 2013/0100053 A1* | 4/2013 | Kang | G06F 3/03 345/173 |
| 2013/0127772 A1* | 5/2013 | Guard | G06F 3/044 345/174 |
| 2013/0161070 A1* | 6/2013 | Lee | H05K 3/105 174/250 |
| 2013/0265729 A1* | 10/2013 | Takashita | H01L 24/16 361/760 |
| 2013/0342226 A1* | 12/2013 | Wang et al. | 324/691 |
| 2014/0049505 A1* | 2/2014 | Radivojevic | G06F 3/04883 345/174 |
| 2014/0117324 A1* | 5/2014 | Kim | 257/40 |
| 2014/0210766 A1* | 7/2014 | Kang | G06F 3/044 345/174 |

FOREIGN PATENT DOCUMENTS

| | | |
|---|---|---|
| CN | 102017071 A | 4/2011 |
| CN | 102316675 A | 1/2012 |
| CN | 102736344 A | 10/2012 |

OTHER PUBLICATIONS

Chinese Office Action dated Oct. 18, 2016 in Application No. 201310596209.4.

* cited by examiner

TOUCH WINDOW

CROSS-REFERENCE TO RELATED APPLICATIONS

This application claims the benefit under 35 U.S.C. §119 of Korean Patent Application Nos. 10-2012-0133166, filed Nov. 22, 2012, and 10-2013-0083662, filed Jul. 16, 2013, which are hereby incorporated by reference in their entirety.

BACKGROUND

The disclosure relates to a touch window.

Recently, a touch panel, which performs an input function through the touch of an image displayed on a display device by an input device such as a stylus pen or a hand, has been applied to various electronic appliances.

The touch panel may be representatively classified into a resistive touch panel and a capacitive touch panel. In the resistive touch panel, the position of the touch point is detected by detecting the variation of resistance according to the connection between electrode parts when pressure is applied to an input device. In the capacitive touch panel, the position of the touch point is detected by detecting the variation in capacitance when a finger of the user is touched on the capacitive touch panel between electrode parts. When taking of the convenience of a fabrication scheme and a sensing power, recently, the capacitive touch panel has been spotlighted in a smaller model.

Indium tin oxide (ITO), which has been most extensively used as an electrode part of the touch panel, is highly priced, and requires a high-temperature deposition process and a vacuum process for the purpose of forming an electrode part. In addition, the ITO is physically easily struck due to the bending or the curving of a substrate, so that the characteristic of the ITO for the electrode part is deteriorated. Accordingly, the ITO is not suitable for a flexible device. Further, when the ITO is applied to a touch panel having a large size, a problem occurs due to high resistance.

In order to solve the problem, researches and studies on an alternative electrode part have been actively carried out. The substitute for ITO is formed by making the shape of the mesh using metallic materials. When the mesh is formed using a nano pattern and a micro-pattern, collision or scratch may occur between a mold and the micro-pattern during a demolding process after a mold-imprinting process. Accordingly, the micro-pattern is damaged, causing bad influence upon an electrode material formed on a micro-pattern.

Further, upon formation of the mesh, undercut by an etching solution occurs between the micro-pattern and the electrode material. Accordingly, the adhesive strength between the micro-pattern and the electrode material is reduced. Therefore, the electrode material may be delaminated during a process of manufacturing a touch panel because the electrode material becomes weak against external impact or chemicals.

BRIEF SUMMARY

The embodiment provides a touch window having improved reliability.

A light emitting device according to the embodiment includes touch window including: a substrate; and an electrode part on the substrate, wherein the electrode part includes: a first sub-pattern; an electrode layer on the first sub-pattern; and a second sub-pattern close to the first sub-pattern, and wherein a boundary area between the electrode layer and the first sub-pattern is larger than a boundary area between the substrate and the first sub-pattern.

A light emitting device package according to the embodiment includes a touch window including: a substrate; and an electrode part on the substrate; wherein the electrode part includes: a first sub-pattern; an electrode layer on the first sub-pattern; and a second sub-pattern close to the first sub-pattern, and wherein a line width of the first sub-pattern is changed according to a height of the first sub-pattern.

An electrode part of the touch window according to the embodiment has a mesh shape so that the pattern of the transparent electrode part may not be viewed in the active area. That is, the pattern may not be viewed even if the electrode part is made from a metal. In addition, even when the electrode part is applied to a large-size touch window, the resistance of the touch window can be reduced. In addition, even when the electrode part is formed through the printing process, the printing quality can be improved so that the high-quality touch window can be ensured.

When the first sub-pattern is formed, the first sub-pattern may be inhibited from being imperfectly formed. That is, when the first sub-pattern is formed through an imprinting process using the mold, collision between the mold and the first sub-pattern may be inhibited and the mold and the first sub-pattern may be inhibited from being scratched during a demolding procedure. Accordingly, the first sub-pattern 211 may be inhibited from being damaged, and an electrode layer may be formed on the first sub-pattern 211 without damage. As a result, the electrode layer may be inhibited from being open circuited to improve reliability.

Further, according to the embodiment, the contact area between the electrode layer and the first sub-pattern may be increased. Accordingly, the adhesive strength between the electrode layer and the first sub-pattern can be improved. Therefore, the electrode layer may be inhibited from being delaminated due to external impact or stimulation by chemicals during a process of manufacturing a touch window. Further, undercut may be inhibited when the etching process is performed after forming the electrode material. That is, stabilization of a process of manufacturing the touch window can be expected, and manufacturing failure is minimized so that the reliability of the touch window can be improved.

DETAILED DESCRIPTION

Figure 1:
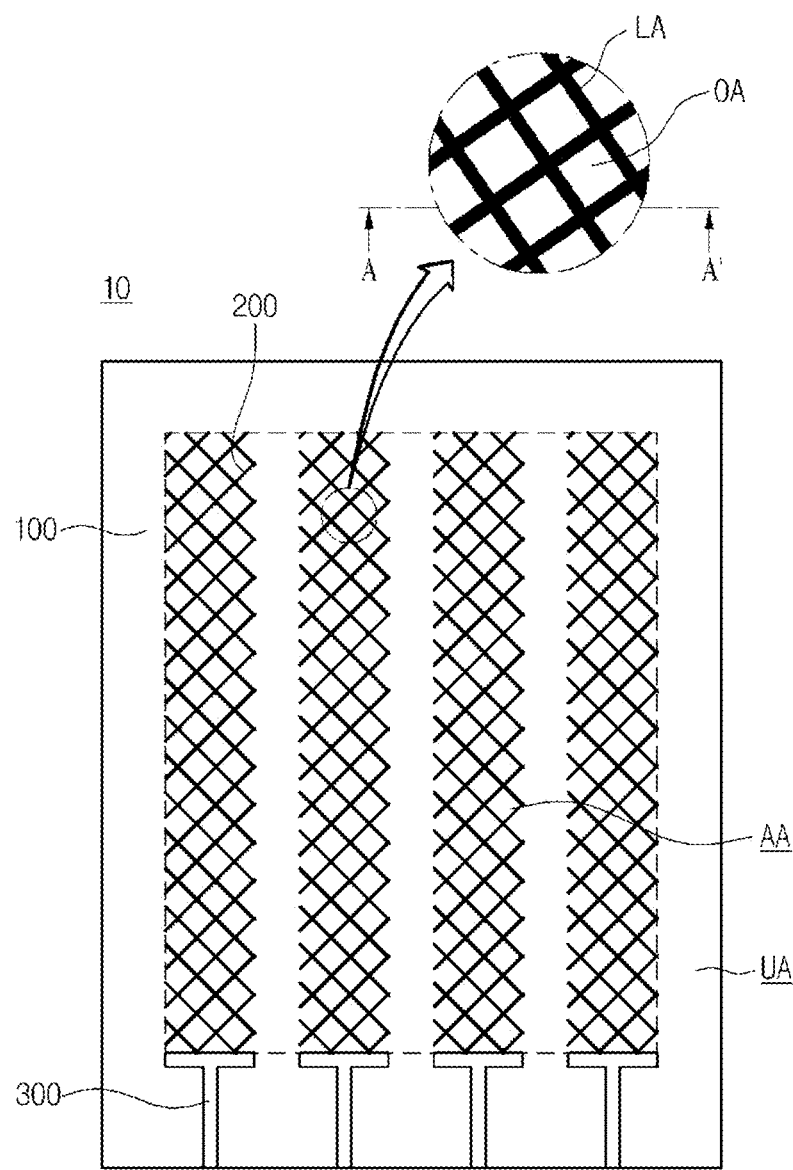
FIG. 1 is a plan view of a touch window according to the embodiment.

In the description of the embodiments, it will be understood that, when a layer (or film), a region, a pattern, or a structure is referred to as being "on" or "under" another layer (or film), another region, another pad, or another pattern, it can be "directly" or "indirectly" on the other layer (or film), region, pad, or pattern, or one or more intervening layers may also be present. Such a position of the layer has been described with reference to the drawings.

The thickness and size of each layer (film), region, pattern, or structure shown in the drawings may be exaggerated, omitted or schematically drawn for the purpose of convenience or clarity. In addition, the size of each layer (film), region, pattern, or structure does not utterly reflect an actual size.

Hereinafter, embodiments will be described with reference to accompanying drawings.

Figure 3:
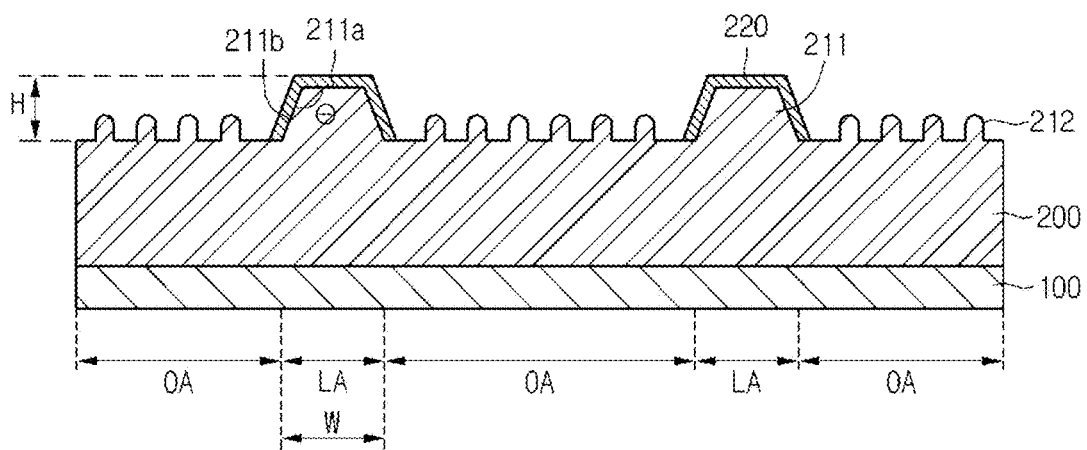
FIG. 3 is a sectional view taken along line A-A' of FIG. 1.

First, the touch window according to the embodiment will be described in detail with reference to FIGS. 1 and 3. FIG. 1 is a plan view of the touch window according to the embodiment. FIG. 3 is a sectional view taken along line A-A' of FIG. 1.

Referring to FIG. 1, the touch window 10 according to the present embodiment includes a substrate 100 in which an active area AA to detect the position of an input device (e.g., finger) and an unactive area UA provided at a peripheral portion of the active area AA are defined.

In this case, the active area AA may be provided therein with electrode parts 200 that may sense the input device. In addition, the unactive area UA may be provided therein with wires 300 electrically connecting the electrode parts 200 to each other. Further, the unactive area UA may be provided therein with an external circuit connected to the wires 300.

If the input device such as the finger touches the touch panel, the variation of capacitance occurs in the touched part by the input device, and the touched part subject to the variation of the capacitance may be detected as a touch point.

Hereinafter, the touch window will be described in more detail.

The substrate 100 may include various materials to support the electrode parts 200, the wires 300, and a circuit board formed on the substrate 100. For instance, the substrate 100 may include a glass substrate or a plastic substrate.

The outer dummy layer is formed in the unactive area UA of the substrate 100. The outer dummy layer may be coated with a material having a predetermined color so that the wires 300 and a printed circuit board connecting the wires 300 to external circuits cannot be seen from the outside. The outer dummy layer may have a color suitable for a desired outer appearance thereof. In addition, a desired logo may be formed in the outer dummy layer through various methods. The outer dummy layer may be formed through a deposition, print, or wet coating scheme.

The electrode part 200 may be formed on the substrate 100. The electrode part 200 may detect whether the input device such as the finger is touched. FIG. 1 illustrates the electrode part 200 extending in one direction on the substrate 100, but the embodiment is not limited thereto. Accordingly, the electrode part 200 may extend in a direction crossing the one direction. In addition, the electrode part 200 may two types of electrode parts having a shape extending in one direction and a shape extending in another direction.

Although FIG. 1 shows the electrode part 200 having s a bar shape, the embodiment is not limited thereto. For instance, the electrode part 200 has various shapes such as a polygonal shape including a diamond shape, a triangular shape or a rectangular shape, a circular shape, or an elliptical shape.

Figure 2:
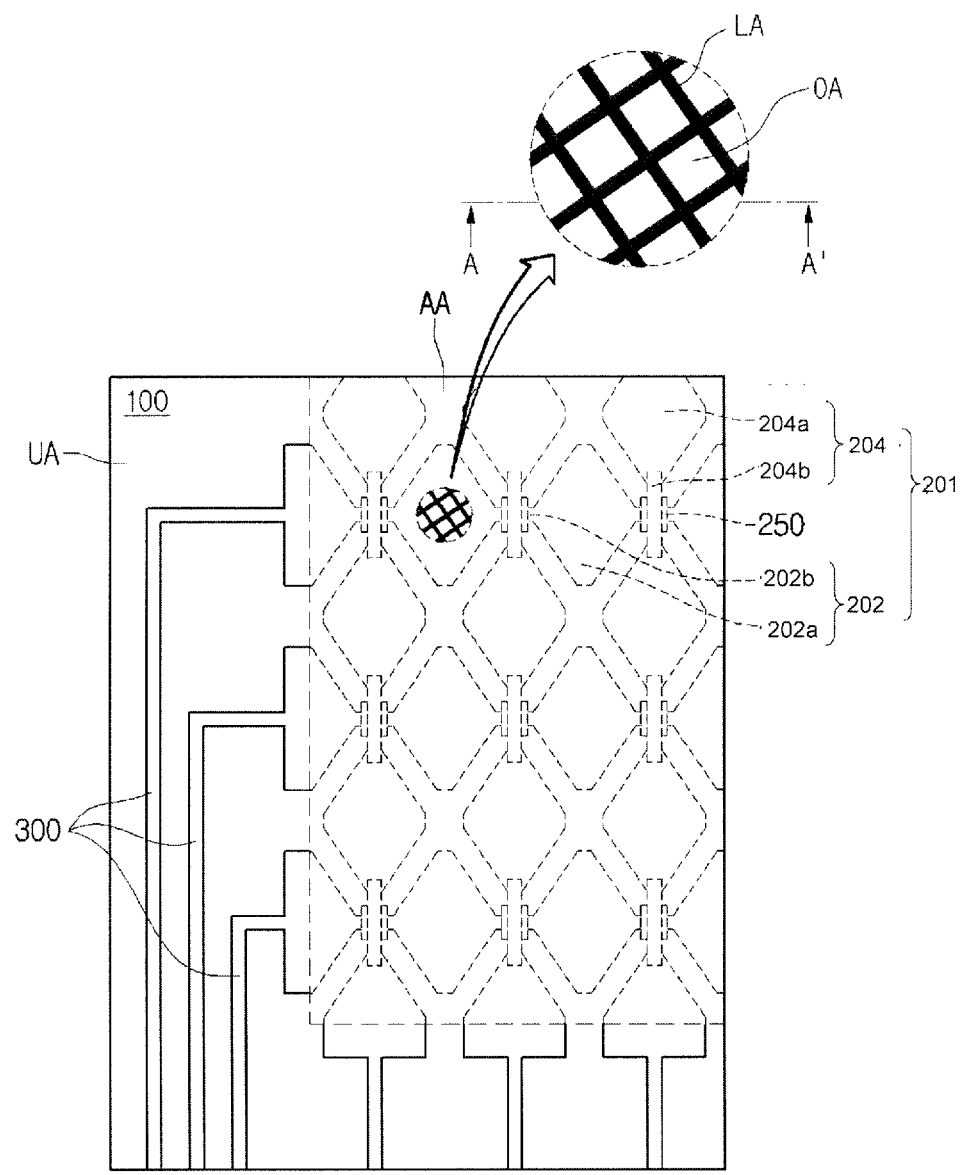
FIG. 2 is a plan view of a touch window according to another embodiment.

Meanwhile, referring to FIG. 2, the electrode part 201 may include a first electrode part 202 and a second electrode part 204.

The first electrode part 202 includes a plurality of first sensor parts 202*a* to detect whether the input device such as the finger is touched, and first connection electrode parts 202*b* to connect the first sensor parts 202*a* to each other. The first connection electrode parts 202*b* connect the first sensor parts 202*a* to each other in a first direction (X-axis direction in the drawings), so that the first electrode part 202 may extend in the first direction, Similarly, the second electrode part 204 includes a plurality of second sensor parts 204*a* to detect whether the input device such as the finger is touched, and second connection electrode parts 204*b* to connect the second sensor parts 204*a* to each other. The second connection electrode parts 204*b* connect the second sensor parts 204*a* to each other in a second direction (Y-axis direction in accompanying drawings), so that the second electrode part 204 may extend in the second direction.

An insulating layer 250 may be located between the first and second connection electrode parts 202*b* and 204*b* in order to prevent the electrical short therebetween. The insulating layer 250 may include a transparent insulating material to insulate the first electrode part 202 from the second electrode part 204.

The electrode part 200 is arranged in the shape of a mesh. In particular, the electrode part 200 includes a mesh opening OA and a mesh line LA. In this case, a line width of the mesh line LA may be in the range of 0.1 μm to 10 μm. A mesh line LA of 0.1 μm or less may not be formed due to the characteristic of the manufacturing process. If the line width is 10 μm or less, the pattern of the electrode part 200 may not be viewed. Preferably, the line width of the mesh line LA may be in the range of 1 μm to 5 μm.

Meanwhile, as shown in FIGS. 1 and 2, the mesh opening OA may have the shape of a rectangle, but the embodiment is not limited thereto. The mesh opening OA may have various shapes such as a polygonal shape including a diamond shape, a pentagonal shape, or a hexagonal shape, or a circular shape.

As the electrode part 200 has the shape of the mesh, the pattern of the electrode part 200 may not be viewed in the active area AA. In other words, even when the transparent electrode part 200 includes metal, the pattern may not be viewed. In addition, even when the electrode part 200 is applied to a large-size touch window, the resistance of the touch window can be reduced. Further, when the transparent electrode part 200 is formed through the printing process, the printing quality can be improved so that the high-quality touch window can be ensured.

Referring to FIG. 3, the electrode part 200 may include first sub-pattern 211, a second sub-pattern 212, and an electrode layer 220.

The first sub-pattern 211 is disposed above the substrate 100. The first sub-pattern 211 is disposed on the mesh line LA. Accordingly, the first sub-pattern 211 is arranged in the shape of a mesh. The first sub-pattern 211 may be carved in relief.

A line width of the first sub-pattern 211 is changed according to a height of the first sub-pattern 211. In detail, a line width of the sub-pattern 211 becomes narrowed a height of the first sub-pattern 211 is increased. Accordingly, as shown in FIG. 2, one section of the first sub-pattern 211 may have a trapezoid shape.

In this case, the ratio of the widest line width of the first sub-pattern 211 to a height of the first sub-pattern 211 may be 10:2 to 10:4. Preferably, the ratio of the widest line width of the first sub-pattern 211 to the height of the first sub-pattern 211 may be 10:2 to 10:3.

Through the line width and height conditions, when the first sub-pattern 211 is formed, the first sub-pattern 211 may be inhibited from being imperfectly formed. That is, when the first sub-pattern 211 is formed through an imprinting process using the mold, collision between the mold and the first sub-pattern 211 may be inhibited and the mold and the first sub-pattern 211 may be inhibited from being scratched during a demolding procedure. Accordingly, the first sub-pattern 211 may be inhibited from being damaged, and an electrode layer 220 may be formed on the first sub-pattern 211 without damage. As a result, the electrode layer 220 may be inhibited from being open circuited to improve reliability.

Meanwhile, the first sub-pattern 211 includes a top surface 211a and a lateral side 211b. The lateral side 211b is inclined from the top surface 211a. The lateral side 211b may be inclined from the top surface 211 outward. That is, the lateral side 211b is inclined.

Accordingly, an angle θ between the top surface 211a and the lateral side 211b may exceed 90°. In detail, an angle θ between the top surface 211a and the lateral side 211b may be 120° or greater.

Through the above angle conditions, when forming the first sub-pattern 211, the first sub-pattern 211 may be inhibited from being imperfectly formed. That is, when the first sub-pattern 211 is formed through an imprinting process using the mold, collision between a mold and the first sub-pattern 211 may be inhibited and the mold and the first sub-pattern 211 may be inhibited from being scratched during a demolding procedure. Accordingly, the first sub-pattern 211 may be inhibited from being damaged, and an electrode layer 220 may be formed on the first sub-pattern 211 without damage. As a result, the electrode layer 220 may be inhibited from being open circuited, thereby improving reliability.

The second sub-pattern 212 is disposed above the substrate 100. The second sub-pattern 212 is disposed on the mesh opening OA. Accordingly, the second sub-pattern 212 may be disposed between the first sub-patterns 211. The second sub-pattern 212 may be carved in relief.

A line width of the second sub-pattern 212 is smaller than a line width of the first sub-pattern 211. Further, the height of the second sub-pattern 212 is smaller than a height of the first sub-pattern 211.

The first sub-pattern 211 and the second sub-pattern 212 may include resin and polymer.

The electrode layer 220 is disposed on the first sub-pattern 211. The electrode layer 220 may be disposed on the whole area of the first sub-pattern 211. That is, the electrode layer 220 may be disposed around the first sub-pattern 211.

Meanwhile, the electrode layer 220 may be disposed at a part of the lateral side 211b of the first sub-pattern 211. That is, the electrode layer 220 is not formed on the whole area of the first sub-pattern 211 but is formed at only a part of the first sub-pattern 211.

The electrode part 200 is disposed at the mesh line LA, and is arranged in the shape of a mesh. For example, the electrode layer 220 may include Cu, Au, Ag, Al, Ti, Ni, or an alloy thereof.

Next, the wire 300 is formed at the unactive area UA. The wire 300 may apply an electric signal to the electrode part 200. The wire 300 may be formed at the unactive area UA not to be viewed.

Meanwhile, although not shown, a circuit board connected to the wire 300 may be provided. Various types of printed circuit boards may be used as the printed circuit board. For instance, a flexible printed circuit board (FPCB) may be used as the printed circuit board.

Hereinafter, a touch window according to another embodiment will be described with reference to FIGS. 4 to 6. For the purpose of simplicity and clarity, the description about the elements identical to or similar to those of the first embodiment will be omitted.

Figure 4:
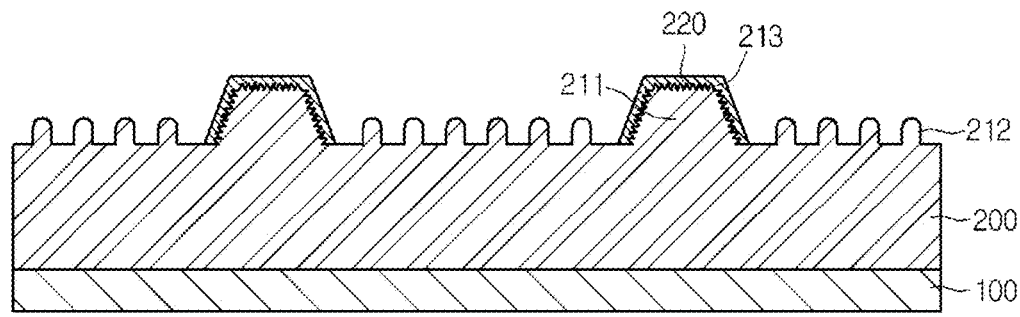
FIG. 4 is a sectional view of a touch window according to another embodiment.

Referring to FIG. 4, a third sub-pattern 213 is disposed on the first sub-pattern 211. That is, the third sub-pattern 213 may be disposed at a top surface and a lateral side of the first sub-pattern 211. The third sub-pattern 213 may include a fine pattern. For example, the third sub-pattern 213 may include a plurality of protrusions.

The electrode layer 220 may be disposed on the third sub-pattern 213. The third sub-pattern 213 may improve the adhesive strength between the electrode layer 220 and the first sub-pattern 211. Accordingly, the third sub-pattern 213 may prevent the electrode layer 220 from being delaminated.

The third sub-pattern 213 may include the same material as that of the first sub-pattern 211. That is, the third sub-pattern 213 may include resin. However, the embodiment is not limited thereto. The third sub-pattern 213 may include various materials capable of improving an adhesive strength.

Figure 5:
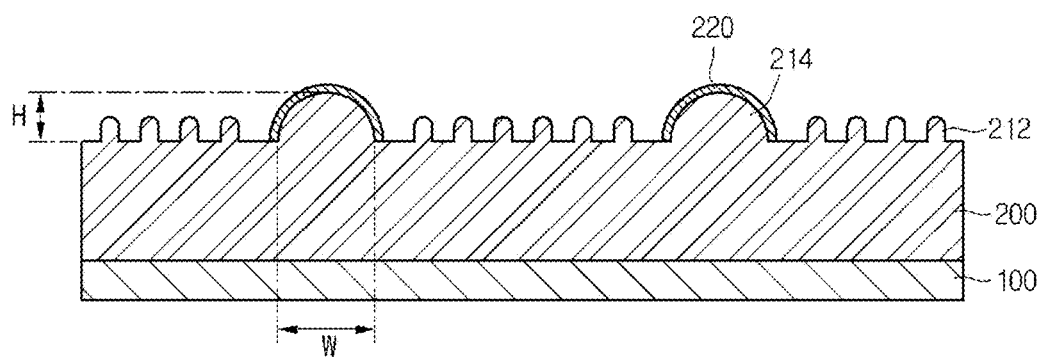
FIG. 5 is a sectional view of a touch window according to another embodiment.

Meanwhile, referring to FIG. 5, the first sub-pattern 214 includes a curved surface. In detail, the first sub-pattern 214 may have a hemisphere shape. That is, the first sub-pattern 214 may have a semicircle shape.

In this case, the ratio of the widest line width of the first sub-pattern 214 to a height of the first sub-pattern 214 may be 10:2 to 10:4. Preferably, the ratio of the widest line width of the first sub-pattern 214 to a height of the first sub-pattern 214 may be 10:2 to 10:3.

Through the line width and height conditions, when the first sub-pattern 214 is formed, the first sub-pattern 214 may be prevented from being imperfectly formed. That is, when the first sub-pattern 214 is formed through an imprinting process using the mold, collision between a mold and the first sub-pattern 214 may be prevented and the mold and the first sub-pattern 214 may be prevented from being scratched during a demolding procedure. Accordingly, the first sub-pattern 214 may be prevented from being damaged, and an electrode layer 220 may be formed on the first sub-pattern 214 without damage. As a result, the electrode layer 220 may be prevented from being open circuited, thereby improving reliability.

Figure 6:
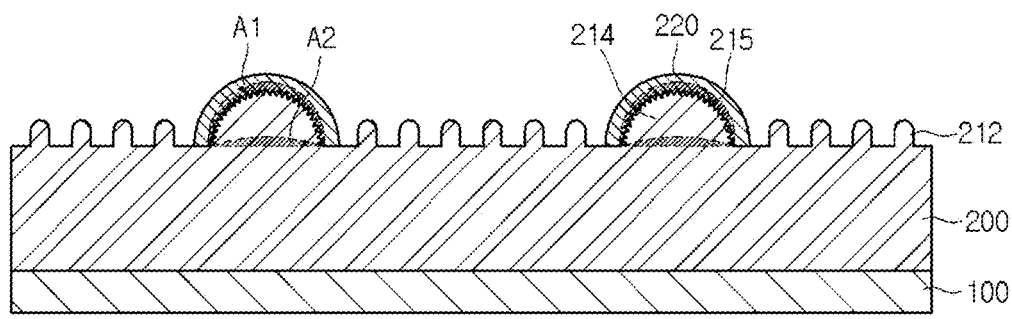
FIG. 6 is a sectional view of a touch window according to another embodiment.

Referring to FIG. 6, a third sub-pattern 215 is further disposed on the first sub-pattern 214. That is, the third sub-pattern 215 may be disposed on a top surface or a lateral side of the first sub-pattern 214. The third sub-pattern 215 may include a fine pattern. For example, the third sub-pattern 215 may include a plurality of protrusions.

An electrode layer 220 may be disposed on the third sub-pattern 215. The third sub-pattern 215 may improve the adhesive strength between the electrode layer 220 and the first sub-pattern 214. Accordingly, the third sub-pattern 213 may prevent the electrode layer 220 from being delaminated.

The third sub-pattern 215 may include the same material as that of the first sub-pattern 214. That is, the third sub-pattern 215 may include resin. However, the embodiment is not limited thereto. The third sub-pattern 215 may include various materials capable of improving an adhesive strength.

Meanwhile, the electrode layer 220 may be disposed at a part of the first sub-pattern 214 having a hemisphere shape.

Figure 7:
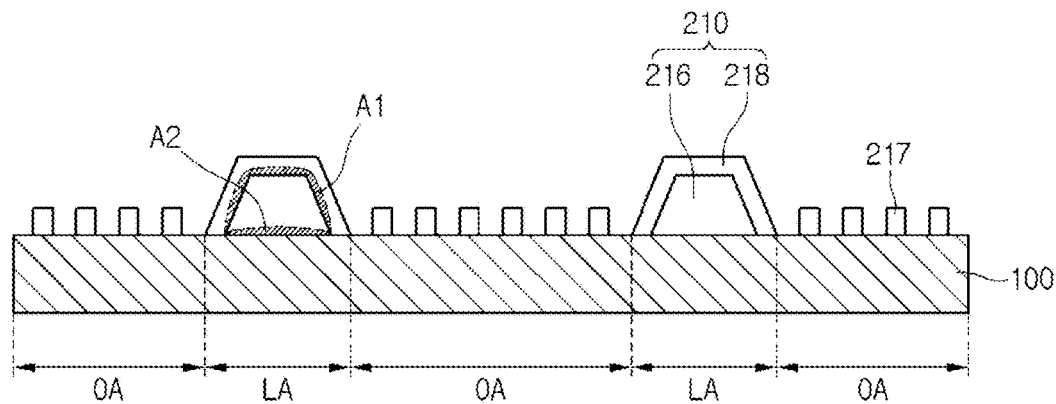
FIGS. 7 and 8 are sectional views of a touch window according to another embodiment.

Meanwhile, referring to FIG. 7, a boundary area A1 between the electrode layer 218 and the first sub-pattern 216 may be larger than a boundary area A2 between the first substrate 100 and the first sub-pattern 216. In detail, a contact area A1 between the first electrode layer 218 and the first sub-pattern 216 may be larger than a contact area A2 between the substrate 100 and the first sub-pattern 216. In detail, referring to FIG. 2, one section of the first sub-pattern 216 may have a trapezoid shape, and the electrode layer 218 is disposed on the first sub-pattern 216. The electrode layer 218 is disposed on a top surface and a lateral side of the first sub-pattern 216 according to a shape of the first-sub pattern 216. Accordingly, a contact area A1 between the electrode layer 218 and the first sub-pattern 216 may be increased. Accordingly, the adhesive strength between the electrode layer 218 and the first sub-pattern 216 can be improved. Accordingly, the electrode layer 218 may be prevented from being delaminated due to external operations or stimulation by chemicals during a procedure of manufacturing a touch window. Further, undercut may be prevented when the etching process is performed after a material of the electrode layer is formed. That is, stabilization of a process of manufacturing the touch window can be expected, and manufacturing failure is minimized so that the reliability of the touch window can be improved.

Figure 8:
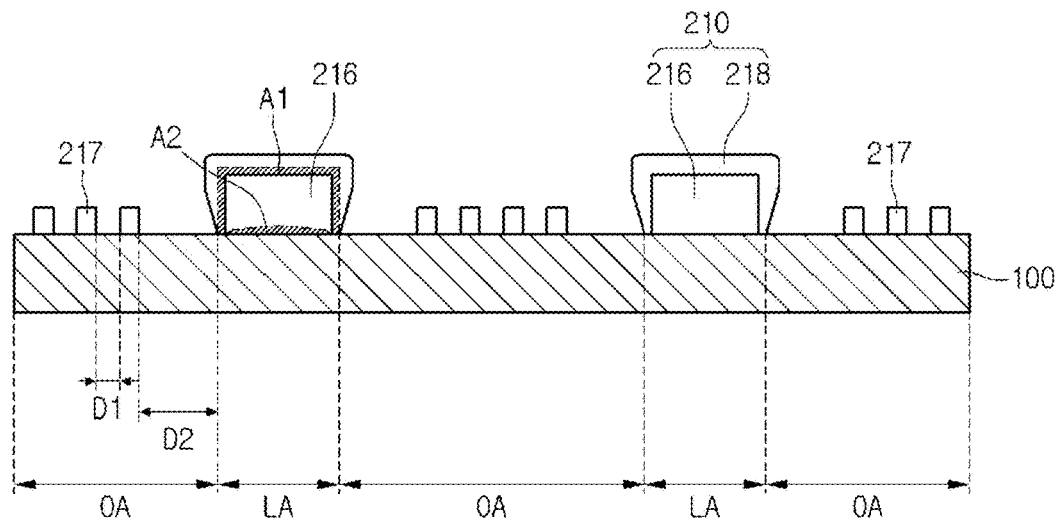

Meanwhile, referring to FIG. 8, a first distance D1 may be defined between the second sub-patterns 217 and a second distance D2 may be defined between the first sub-pattern 216 and the second sub-pattern 217, in which the second distance D2 may be longer than the first distance D1. That is, the second distance D2 between the first sub-pattern 216 and the second sub-pattern 217 may be greater than the first distance D1 between the second sub-patterns 217. Accordingly, when the material of an electrode layer is formed on the first sub-pattern 216 and the second sub-pattern 217, the material of an electrode layer is formed over the second distance D2. Accordingly, when the subsequent etching process is performed, an area of the electrode layer 218 may be maximized on the first-sub pattern 216.

Figure 9:
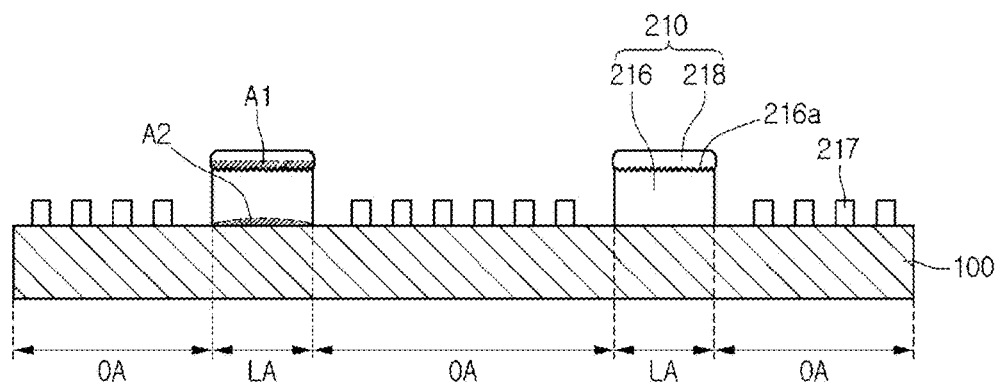
FIGS. 9 to 13 are sectional views showing a method for manufacturing the touch panel according to the embodiment.

Next, referring to FIG. 9, a plurality of projections are disposed on a top surface of the first sub-pattern 216. Roughness of the top surface of the first sub-pattern 216 is greater than roughness of the top surface of the second sub-pattern 217. Surface roughness on the top surface of the first sub-pattern 216 may be increased by surface-treating the top surface using plasma treatment. Accordingly, a contact surface with the electrode layer 218 can be ensured and an adhesive force can be increased.

Figure 10:
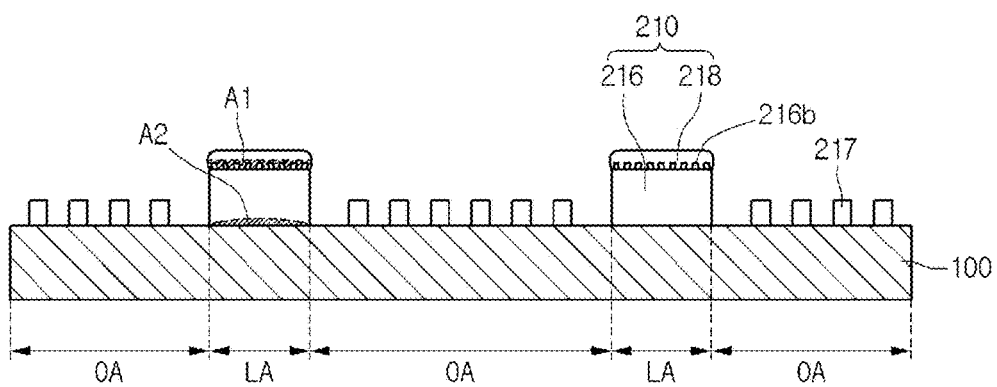

Next, referring to FIG. 10, a plurality of convex portions 216b is disposed on a top surface of the first sub-pattern 216. The convex portion 210 may be formed by processing a top surface of the first sub-pattern 216. Accordingly, the convex portion 216b may be formed integrally with the first sub-pattern 216. However, the embodiment is not limited thereto. The convex portions 216b may be separately formed on the first sub-pattern 216 by the secondary processing.

Figure 11:
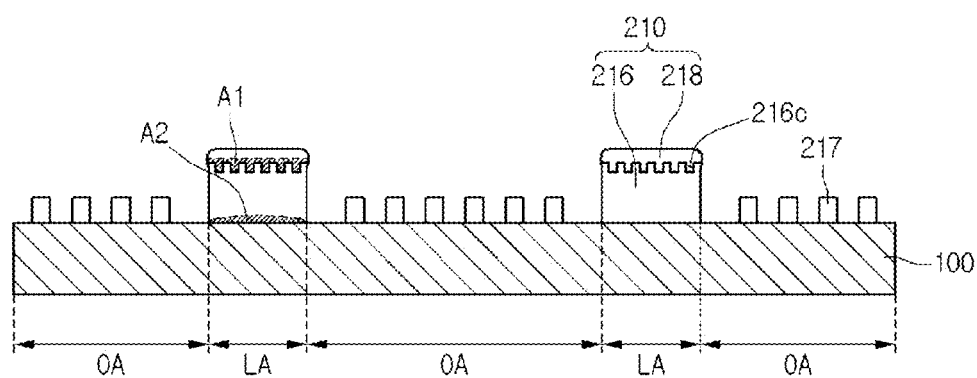

Next, referring to FIG. 11, a plurality of concave portions 216c is disposed on a top surface of the first sub-pattern 216. The concave portion 216c may be formed by processing a top surface of the first sub-pattern 216.

Hereinafter, a method of manufacturing a touch window according to the embodiment with reference to FIGS. 12 to 16.

Figure 12:
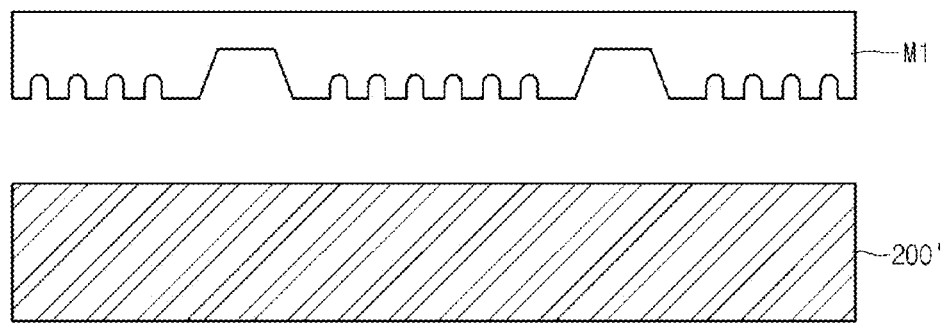
Figure 13:
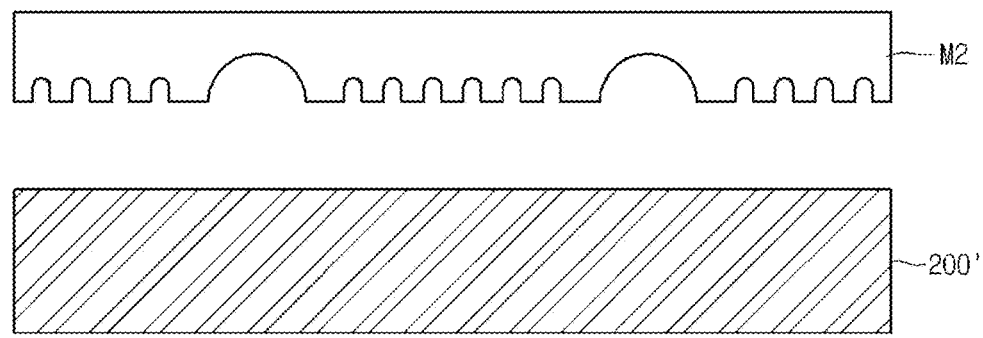

First, referring to FIGS. 12 and 13, molds M1 and M2 on which a desired pattern is formed may be disposed on a resin layer 200'. Meanwhile, shapes of the molds M1 and M2 may be changed according to a shape of the pattern to be formed. In this case, the resin layer 200' may include UV resin and polymer.

Figure 14:
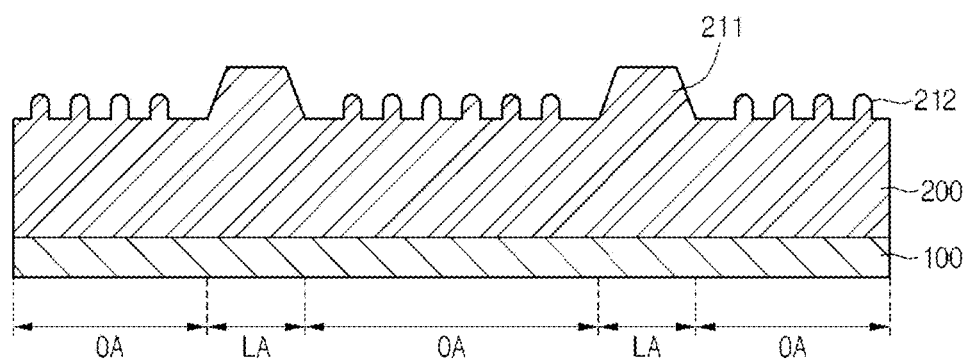
FIGS. 14 to 19 are sectional views illustrating a display where a touch window according to the embodiment is disposed on a display panel.

Molds M1 and M2 may be imprinted on the resin layer 200'. Referring to FIG. 14, the first sub-pattern 211 and the second sub-pattern 212 may be manufactured through the imprinting process. FIG. 14 illustrates a firsts sub-pattern 211 and a second sub-pattern 212 formed through the mold M1 shown in FIG. 12.

Figure 15:
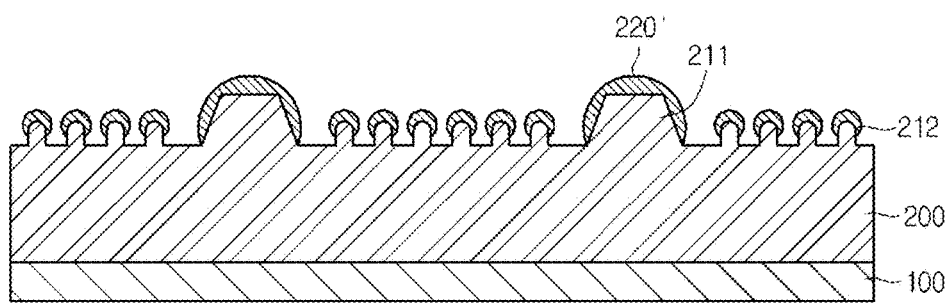

Next, referring to FIG. 15, an electrode material 220' may be formed on the first sub-pattern 211 and the second sub-pattern 212. The electrode material 220' may be formed through a deposition process or a plating process.

Figure 16:
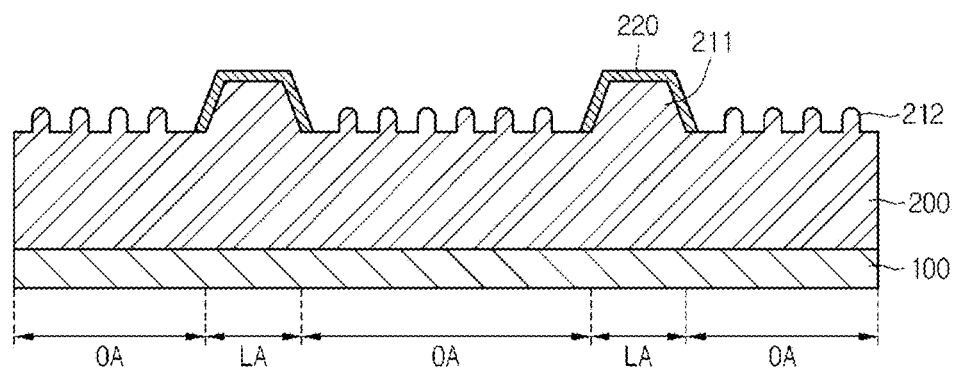

Referring to FIG. 16, the electrode material 220' may be etched. In this case, an etch area may vary depending on structures of the first sub-pattern 211 and the second sub-pattern 212 and a contact area with respect to the electrode material 220'. That is, since a contact area between the first sub-pattern 211 and the electrode material 220' is larger than a contact area between the second sub-pattern 212 and the electrode material 220', the electrode material 220' formed on the first sub-pattern 211 is less etched. That is, the electrode material 220' remains on the first sub-pattern 211 and the electrode material 220' formed on the sub-pattern 212 is etched and removed under the same etching rate. Accordingly, an electrode layer 220 may be formed on the first sub-pattern 211 and may be arranged in the shape of a mesh.

Figure 17:
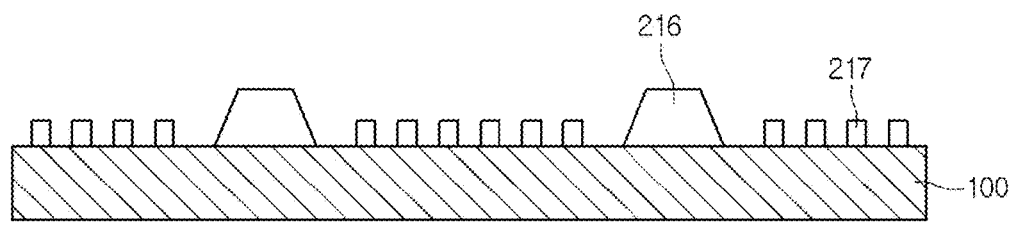
Figure 18:
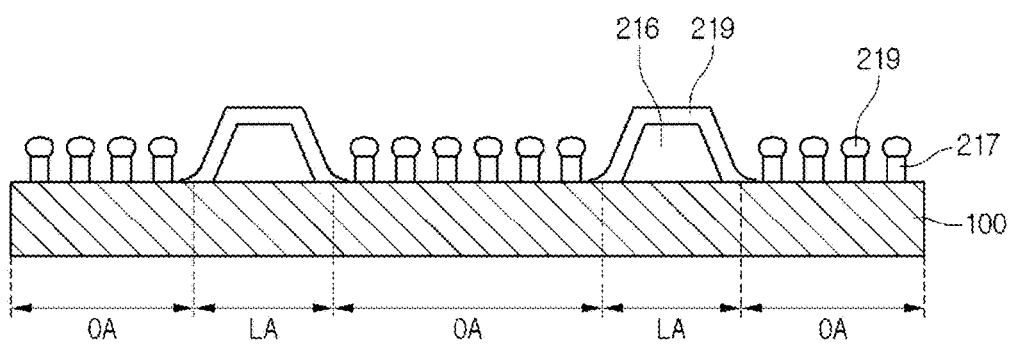

Meanwhile, referring to FIGS. 17 and 18, the first sub-pattern 216 and the second sub-pattern 217 may be directly formed on the substrate 100. The first sub-pattern 216 and the second sub-pattern 217 may include UV resin or polymer.

Figure 19:
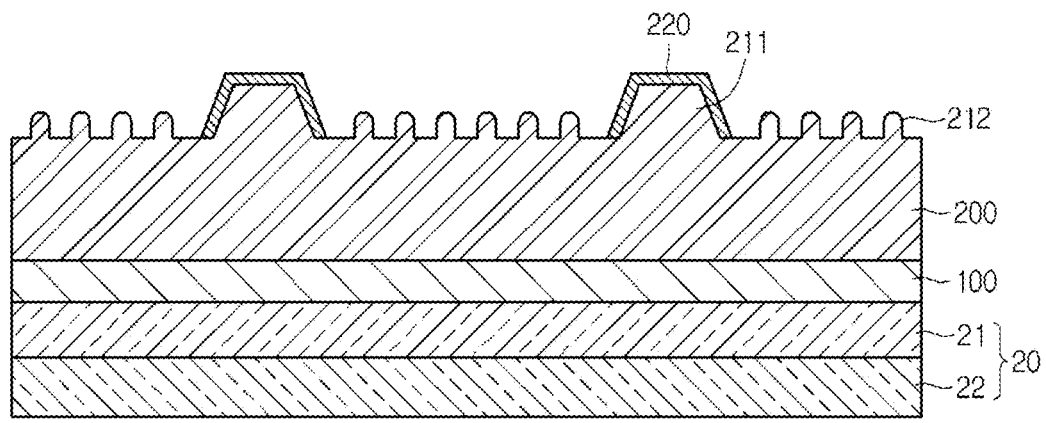

Meanwhile, referring to FIG. 19, the touch window 100 may be disposed on the display panel 20. The touch window 10 is combined with a display panel 20 so that a display device may be formed.

The display panel 20 is formed therein with a display region to display an image. Generally, the display panel applied to the display device may include an upper substrate 21 and a lower substrate 22. A data line, a gate line, and a thin film transistor TFT may be formed on the lower substrate 22. The upper substrate 21 may adhere to the lower substrate 22 to protect constituent elements disposed on the lower substrate 22.

The display panel 20 may have various shapes according to the type of the display device. That is, the display device according to the embodiment may include an LCD, a field emission display, a plasma display panel (PDP), an organic light emitting diode (OLED), and an elecrophoretic display (EPD). Accordingly, the display panel 20 may be configured to have various shapes.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A touch window comprising:
a substrate;
a resin layer on the substrate; and
an electrode part on the resin layer;
wherein the resin layer comprises a first sub-pattern disposed on a mesh line, and a second sub-pattern disposed on a mesh opening;
wherein the electrode part comprises an electrode layer on the first sub-pattern;
wherein the first sub-pattern is arranged in a shape of a mesh,
wherein the second sub-pattern is disposed adjacent to the first sub-pattern;
wherein a boundary area between the electrode layer and the first sub-pattern is larger than a boundary area between the substrate and the first sub-pattern;
wherein a line width of the first sub-pattern is greater than a line width of the second sub-pattern; and
wherein a height of the first sub-pattern is greater than a height of the second sub-pattern.

2. The touch window of claim 1, wherein a contact area between the electrode layer and the first sub-pattern is greater than a contact area between the substrate and the first sub-pattern.

3. The touch window of claim 1, wherein the line width of the first sub-pattern is changed according to a height of the first sub-pattern.

4. The touch window of claim 1, wherein the line width of the first sub-pattern becomes narrowed as a height of the first sub-pattern is increased.

5. The touch window of claim 1, wherein the electrode layer surrounds the first sub-pattern.

6. The touch window of claim 1, wherein the first sub-pattern comprises a top surface and a lateral side, and the lateral side of the first sub-pattern is inclined from the top surface of the first sub-pattern.

7. The touch window of claim 6, wherein an angle between the top surface and the lateral side of the first sub-pattern exceeds 90°.

8. The touch window of claim 1, wherein the first sub-pattern has a curved surface.

9. The touch window of claim 1, wherein the first sub-pattern has a hemispheric shape.

10. The touch window of claim 1, wherein a ratio of a widest line width of the first sub-pattern to a height of the first sub-pattern is 10:2 to 10:4.

11. The touch window of claim 1, wherein a third sub-pattern is formed on a top surface of the first sub-pattern.

12. The touch window of claim 11, wherein the third sub-pattern comprises a plurality of projections.

13. The touch window of claim 11, wherein the electrode layer is disposed on the third sub-pattern.

14. The touch window of claim 1, wherein the electrode part is arranged in a shape of a mesh.

15. The touch window of claim 1, wherein a distance between the first sub-pattern and the second sub-pattern is greater than a distance between the second sub-patterns.

16. The touch window of claim 1, wherein roughness of a top surface of the first sub-pattern is greater than roughness of a top surface of the second sub-pattern.

17. The touch window of claim 1, wherein a concave portion is disposed on a top surface of the first sub-pattern.

18. A touch window comprising:
a substrate;
a resin layer on the substrate; and
an electrode part on the resin layer;
wherein the resin layer comprises a first sub-pattern disposed on a mesh line and
a second sub-pattern disposed on a mesh opening;
wherein the electrode part comprises an electrode layer on the first sub-pattern;
wherein the first sub-pattern is arranged in a shape of a mesh;
wherein the second sub-pattern is disposed adjacent to the first sub-pattern;
wherein a line width of the first sub-pattern is changed according to a height of the first sub-pattern;
wherein a line width of the first sub-pattern is greater than a line width of the second sub-pattern; and
wherein a height of the first sub-pattern is greater than a height of the second sub-pattern.

19. The touch window of claim 18, wherein the line width of the first sub-pattern becomes narrowed as a height of the first sub-pattern is increased.

20. The touch window of claim 18, wherein a boundary area between the electrode layer and the first sub-pattern is greater than a boundary area between the substrate and the first sub-pattern.

* * * * *